(12) United States Patent
Hwang

(10) Patent No.: US 7,894,786 B2
(45) Date of Patent: Feb. 22, 2011

(54) GAIN CONTROLLED AND MULTI-BAND PROCESSING RECEIVER

(75) Inventor: Myung Woon Hwang, Seoul (KR)

(73) Assignee: FCI Inc., Seongnam-shi, Gyeonggi-do (KR)

( * ) Notice: Subject to any disclaimer, the term of this patent is extended or adjusted under 35 U.S.C. 154(b) by 657 days.

(21) Appl. No.: 11/865,171

(22) Filed: Oct. 1, 2007

(65) Prior Publication Data

US 2008/0081573 A1    Apr. 3, 2008

(30) Foreign Application Priority Data

Oct. 2, 2006    (KR)    ................. 10-2006-0097040

(51) Int. Cl.
*H04B 7/00*    (2006.01)

(52) U.S. Cl. .............. 455/245.1; 455/251.1; 455/226.1; 455/234.1

(58) Field of Classification Search .............. 455/226.1, 455/226.2, 234.1, 245.2, 251.1, 311
See application file for complete search history.

(56) References Cited

U.S. PATENT DOCUMENTS

| | | | | |
|---|---|---|---|---|
| 4,245,353 | A * | 1/1981 | Bynum | 455/239.1 |
| 4,872,206 | A * | 10/1989 | Graziadei et al. | 455/241.1 |
| 6,965,655 | B1 * | 11/2005 | Mostov et al. | 375/345 |
| 6,993,291 | B2 * | 1/2006 | Parssinen et al. | 455/67.11 |
| 7,016,654 | B1 * | 3/2006 | Bugeja | 455/73 |
| 7,139,542 | B2 * | 11/2006 | Vepsalainen et al. | 455/266 |
| 7,212,798 | B1 * | 5/2007 | Adams et al. | 455/251.1 |
| 7,295,813 | B2 * | 11/2007 | Haub et al. | 455/67.13 |
| 7,299,021 | B2 * | 11/2007 | Pärssinen et al. | 455/226.1 |
| 7,486,941 | B2 * | 2/2009 | Rahman et al. | 455/234.1 |
| 7,639,998 | B1 * | 12/2009 | Halvorson | 455/251.1 |
| 2002/0197975 | A1 * | 12/2002 | Chen | 455/324 |

* cited by examiner

*Primary Examiner*—Duc M Nguyen
(74) *Attorney, Agent, or Firm*—Kile Park Goekjian Reed & McManus PLLC

(57) ABSTRACT

Provided is a receiver capable of automatically controlling a gain of the receiver and receiving three or more band signals. A gain controlled receiver includes a low noise amplifier, a first variable gain control amplifier, a frequency mixer, a filter, a second variable gain control amplifier, and a gain control block. The gain controlled receiver automatically controls gains of the low noise amplifier, the first variable gain control amplifier, the frequency mixer, the filter, the second variable gain control amplifier by detecting strength of the signals processed in the receiver. Therefore, without an additional manual tuning operation, the gain of the receiver can be automatically maintained in an optimal state. A multi-band processing receiver includes a first receiving unit, a second receiving unit, and a switch. The multi-band processing receiver can process three or more RF signals in multi-band by using a single receiver.

19 Claims, 4 Drawing Sheets

GAIN CONTROLLED AND MULTI-BAND PROCESSING RECEIVER

This application claims priority to Korean Patent Application No. 10-2006-0097040, filed on Oct. 2, 2006, all the benefits accruing therefrom under 35 U.S.C. §119, the contents of which in its entirety is incorporated herein by reference.

BACKGROUND OF THE INVENTION

1. Field of the Invention

The present invention relates to an intermediate frequency receiver, and more particularly, to an intermediate frequency receiver for digital multimedia broadcasting.

2. Description of the Related Art

A transmitting end for transmitting electromagnetic waves through the air in wireless communication is designed to satisfy the following conditions.

First, the transmitting end has to transmit the electromagnetic waves by using an optimal power so that a receiving end can receive signals.

Second, when the transmitting end transmits the electromagnetic waves by using several channels, interferences between the channels have to be avoided.

The receiving end for selectively receiving electromagnetic waves in the air has to satisfy the following conditions.

First, the receiving end has to amplify weak signals in the air transmitted from the transmitting end, and in this case, ingress noise has to be avoided.

Second, when the receiving end receives signals through several channels, the receiving end has to receive only signals of a desired channel.

The wireless communication uses radio frequency (RF) signals as the signals transmitted from the transmitting end and received to the receiving end through the air. In the air, various types of noise and different types of frequency signals exist. Therefore, the electromagnetic waves are exposed to the noises, and strength of the signals is attenuated due to various factors in the air. In order to accurately select a desired frequency signal in this bad condition, an optimal receiver is required.

Examples of RF bands that are currently used include Band-II, Band-III, L-Band, DVB-H, ISDB-T, and so on. Therefore, various types of receivers that can receive signals in the various RF bands have been introduced.

FIG. 1 is a block diagram illustrating a conventional dual-band receiver.

Referring to FIG. 1, the conventional dual-band receiver 100 includes a filter 110, an input tuner 120, an amplifying unit 130, an RF tuner 140, a frequency mixer 150, an intermediate frequency (IF) tuner 160, and a local oscillator 170.

The filter 110 performs filtering on a signal in each of two bands received from an antenna. The input tuner 120 performs input tuning on the RF signal filtered by the filter 110 into a corresponding band. The amplifying unit 130 amplifies the RF signal tuned by the input tuner 120. The RF tuner 140 tunes the RF signal amplified by the amplifying unit 130 into a corresponding channel. The frequency mixer 150 mixes a frequency of the signal tuned by the RF tuner 140 with a frequency of an oscillating signal received from the local oscillator 170 to generate an IF signal. The IF tuner 160 tunes the IF signal obtained by the frequency mixer 150. The local oscillator 170 generates a local oscillating signal having a predetermined frequency.

Although not shown in the figure, since signals in a number of channels are received, in order to remove signals in channels which are not desired, a tracking filter has to be disposed at a front portion of the conventional receiver. When the tracking filter is disposed at the front portion of the receiver, in order to select a desired channel, a center frequency of the filter is changed whenever a corresponding channel is changed. Electrical characteristics of the receiver using the filter which changes the center frequency are worse than electrical characteristics of a receiver using a surface acoustic wave (SAW) filter having a fixed center frequency. In addition, there are differences between electrical characteristics of filters included in manufactured receivers, so that there is a problem in that the receivers have to be tuned by manual operation when mass-produced.

Since an apparatus capable of performing automatic gain control of the receiver is not produced, in order to perform gain control of the receiver, a number of external devices are needed for the receiver.

In addition, in order to receive a plurality of band signals, a receiver corresponding to a reception signal in each band has to be provided. In this case, an area and power consumed by a system are linearly increased.

SUMMARY OF THE INVENTION

The present invention provides a gain controlled receiver capable of automatically controlling a gain of the receiver.

The present invention also provides a multi-band processing receiver capable of receiving three or more band signals.

According to an aspect of the present invention, there is provided a gain controlled receiver including a low noise amplifier, a first variable gain control amplifier, a frequency mixer, a filter, a second variable gain control amplifier, and a gain control block. The low noise amplifier amplifies a received radio frequency (RF) signal in response to a first gain control signal. The first variable gain control amplifier amplifies a signal output from the low noise amplifier in response to a second gain control signal. The frequency mixer mixes a signal output from the first variable gain control amplifier with a local oscillating signal in response to a third gain control signal to generate an intermediate frequency (IF) signal. The filter removes noise in an output signal of the frequency mixer in response to a fourth gain control signal. The second variable gain control amplifier amplifies an output signal of the filter in response to a fifth gain control signal, and includes one or more variable gain amplifiers. The gain control block processes the received output signal of the frequency mixer and the output signal of the filter to generate the first to fourth gain control signals.

According to another aspect of the present invention, there is provided a gain controlled receiver including a low noise amplifier, a first variable gain control amplifier, a frequency mixer, a filter, a second variable gain control amplifier, and a gain control block. The low noise amplifier amplifies a received radio frequency (RF) signal in response to a first gain control signal. The first variable gain control amplifier amplifies a signal output from the low noise amplifier in response to a second gain control signal. The frequency mixer mixes a signal output from the first variable gain control amplifier with a local oscillating signal in response to a third gain control signal to generate an IF signal. The filter removes noise in an output signal of the frequency mixer in response to a fourth gain control signal. The second variable gain control amplifier amplifies an output signal of the filter in response to a fifth gain control signal, and includes one or more variable gain amplifiers. The gain control block processes the received output signal of the frequency mixer and the output signal of the second variable gain control amplifier to generate the first to fourth gain control signals.

According to another aspect of the present invention, there is provided a multi-band processing receiver including a first receiving unit, a second receiving unit, and a switch. The first receiving unit includes a first amplifying unit selecting and outputting one of two received signals obtained by amplifying a first band RF signal and a second band RF signal, and first frequency mixer mixing the signal output from the first amplifying unit with a first oscillating signal output from a voltage-controlled oscillator (VCO). The second receiving unit includes a second amplifying unit receiving and amplifying a third band RF signal and a second frequency mixer mixing the signal output from the second amplifying unit with a second oscillating signal output from the VCO. The switch performs switching on the signals output from the first receiving unit and the second receiving unit to output an IF signal.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, exemplary embodiments of the present invention will be described in detail with reference to the attached drawings.

Figure 1:
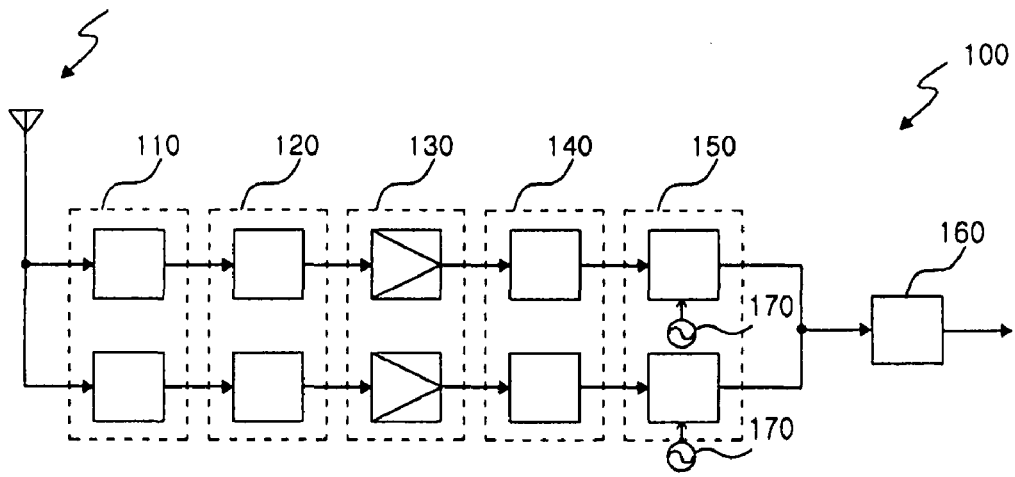
FIG. 1 is a block diagram illustrating a conventional dual-band receiver.
Figure 2:
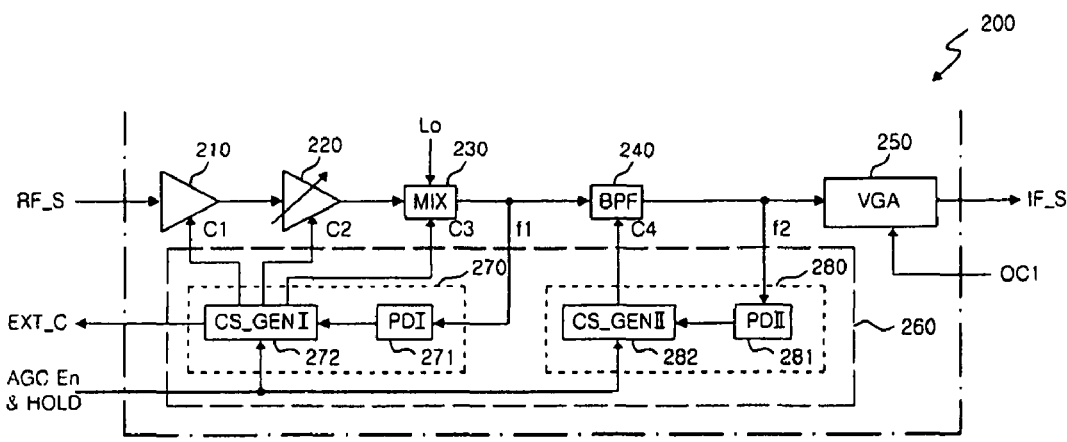
FIGS. 2 to 7 are views illustrating gain controlled receivers according to embodiments of the present invention.

FIG. 2 illustrates a gain controlled receiver according to a first embodiment of the present invention.

Referring to FIG. 2, the gain controlled receiver 200 includes a low noise amplifier 210, a first variable gain control amplifier 220, a frequency mixer 230, a filter 240, a second variable gain control amplifier 250, and a gain control block 260.

The low noise amplifier 210 amplifies a received radio frequency (RF) signal RF_S in response to a first gain control signal C1. The first variable gain control amplifier 220 amplifies a signal output from the low noise, amplifier 210 in response to a second gain control signal C2. The frequency mixer 230 mixes a signal output from the. first variable gain control amplifier 220 with a local oscillating signal Lo in response to a third gain control signal C3 to generate an intermediate frequency (IF) signal f1. The filter 240 removes noise in an output signal of the frequency mixer 230 in response to a fourth gain control signal C4 and has electrical characteristics of a band pass filter. The second variable gain control amplifier 250 amplifies an output signal f2 of the filter 240 in response to a fifth gain control signal, OC1, and includes one or more variable gain amplifiers.

The gain control block 260 processes the received output signal f1 of the frequency mixer 230 and the output signal f2 of the filter 240 in response to a gain control enable/hold signal AGC En & HOLD to generate the first to fourth gain control signals C1 to C4. To do this, the gain control block 260 includes a first gain control block 270 and a second gain control block 280.

The first gain control block 270 generates the first to third gain control signals C1 to C3 according to a state, of the output signal f1 of the frequency mixer 230 in response to the gain control enable/hold signal AGC En & HOLD. To do this, the first gain control block 270 includes a first peak detector 271 and a first control signal generator 272. The first peak detector 271 detects a peak of the output signal f1 of the frequency mixer 230. The first control signal generator 272 generates the first to third gain control signals C1 to C3 by using a peak value of a signal output from the first peak detector 271 in response to the gain control enable/hold signal AGC En & HOLD. The first control signal generator 272 further generates one or more external device control signals EXT_C having information about a gain of an amplification device (not shown) which is provided outside the receiver 200.

The second gain control block 280 generates the fourth gain control signal C4 according to a state of the output signal f2 of the filter 240 in response to the gain control enable/hold signal AGC En & HOLD. To do this, the second gain control block 280 includes a second peak detector 281 and a second control signal generator 282. The second peak detector 281 detects a peak of the output signal f2 of the filter 240. The second control signal generator 282 generates the fourth gain control signal C4 by using a peak value of a signal output from the second peak detector 281 in response to the gain control enable/hold signal AGC En & HOLD.

Here, the first to fourth gain control signals C1 to C4 are used to control gains of the low noise amplifier 210, the first variable gain control amplifier 220, the frequency mixer 230, and the filter 240. The fifth gain control signal OC1 is used to control a gain of the second variable gain control amplifier 250. The gain controlled receiver 200 according to the current embodiment of the present invention automatically controls gains of the function blocks 210, 220, 230, 240, and 250 by detecting strength of the signals f1 and f2 processed in the receiver 200. Therefore, without an additional manual tuning operation, the gain of the receiver can be automatically maintained in an optimal state. When the receiver 200 is constructed with a semiconductor chip, the output IF_S from the second variable gain control amplifier 250 is transmitted to the outside of the chip and used to an apparatus connected to the receiver 200, and the fifth gain control signal OC1 is applied from the outside of the chip.

Here, the gain control enable/hold signal AGC En & HOLD may include one or more digital codes to include various instructions. For example, in order to minimize power consumed by the receiver 200 by halting the auto gain control function, the gain control enable/hold signal AGC En & HOLD outputs a digital code for instructing the gain control block 260 to stop operating. In addition, when it is determined that the gain is in the optimal state, the gain control enable/hold signal AGC En & HOLD instructs a hold mode so as not to perform the gain control operations.

Gain control enable/hold signals described with reference to the drawings described later have the same function as that of the aforementioned gain control enable/hold signal AGC En & HOLD, so that a detailed description thereof is omitted.

Figure 3:
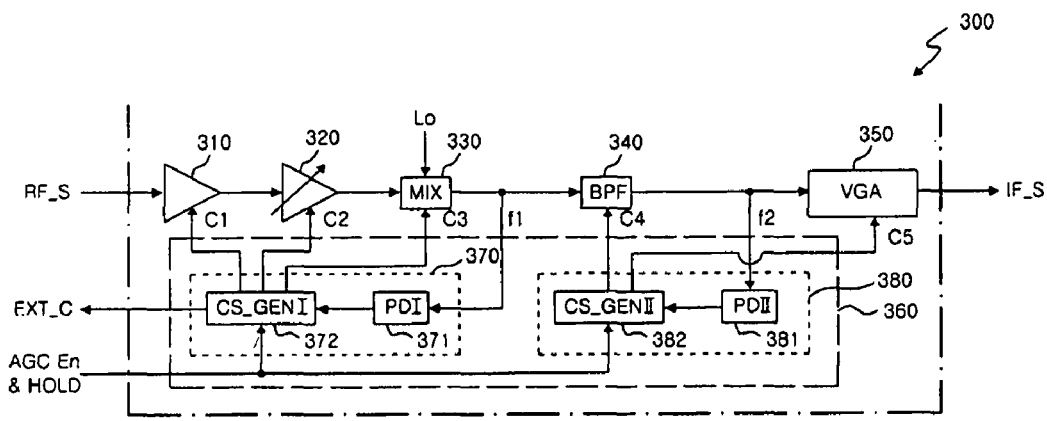

FIG. 3 illustrates a gain controlled receiver according to a second embodiment of the present invention.

Referring to FIG. 3, the gain controlled receiver 300 has the same construction as the gain controlled receiver 200 illustrated in FIG. 2 except that a gain of a second variable gain control amplifier 350 is controlled by a fifth gain control signal C5 output from a gain control block 360. Therefore, a detailed description of connection structures and operations of the gain controlled receiver 300 is omitted.

Figure 4:
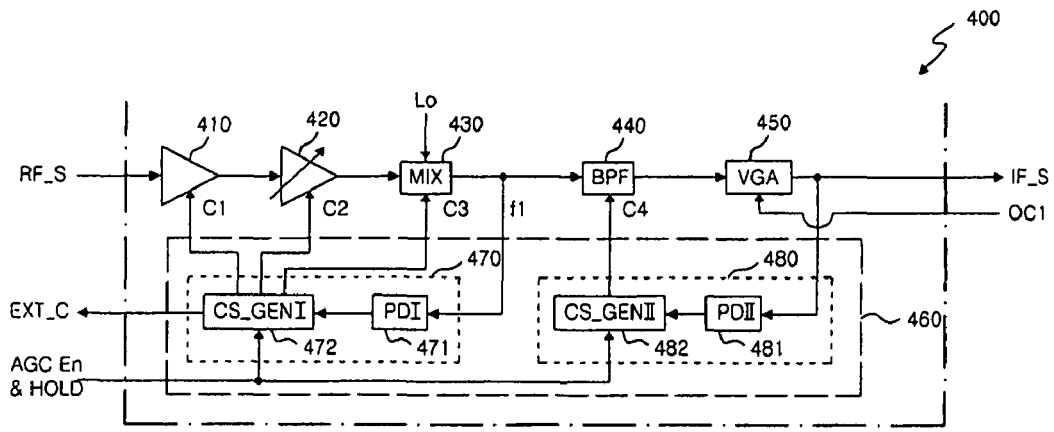

FIG. 4 illustrates a gain controlled receiver according to a third embodiment of the present invention.

Referring to FIG. 4, the gain controlled receiver 400 includes a low noise amplifier 410, a first variable gain control amplifier 420, a frequency mixer 430, a filter 440, a second variable gain control amplifier 450, and a gain control block 460.

The low noise amplifier 410 amplifies a received RF signal RF_S in response to a first gain control signal C1. The first variable gain control amplifier 420 amplifies a signal output from the low noise amplifier 410 in response to a second gain control signal C2. The frequency mixer 430 mixes a signal output from the first variable gain control amplifier 420 with a local oscillating signal Lo in response to a third gain control signal C3 to generate an IF signal f1. The filter 440 removes noise in an output signal f1 of the frequency mixer 230 in response to a fourth gain control signal C4. The second variable-gain control amplifier 450 amplifies an output signal f2 of the filter 440 in response to a fifth gain control signal OC1, and includes one or more variable gain amplifiers.

The gain control block 460 processes the received output signal f1 of the frequency mixer 430 and an output signal IF_S of the second variable gain control amplifier 450 in response to a gain control enable/hold signal AGC En & HOLD to generate the first to fourth gain control signals C1 to C4. To do this, the gain control block 460 includes a first gain control block 470 and a second gain control block 480.

The first gain control block 470 generates the first to third gain control signals C1 to C3 according to a state of the output signal f1 of the frequency mixer 430 in response to the gain control enable/hold signal AGC En & HOLD and, includes a first peak detector 471 and a first control signal generator 472. The first peak detector 471 detects a peak of the output signal f1 of the frequency mixer 430. The first control signal generator 472 generates the first to third gain control signals C1 to C3 by using a peak value of a signal output from the first peak detector 471 in response to the gain control enable/hold signal AGC En & HOLD. The first control signal generator 472 further generates one or more external device control signals EXT_C having information about a gain of an amplification device (not shown) which is provided outside the receiver 400.

The second gain control block 480 generates the fourth gain control signal C4 according to a state of the output signal IF_S of the second variable gain control amplifier 450 in response to the gain control enable/hold signal AGC En & HOLD. To do this, the second gain control block 480 includes a second peak detector 481 and a second control signal generator 482. The second peak detector 481 detects a peak of the output signal IF_S of the second variable gain control amplifier 450. The second control signal generator 482 generates the fourth gain control signal C4 by using a peak value of a signal output from the second peak detector 481 in response to the gain control enable/hold signal AGC En & HOLD.

Since a structure and operations of the gain controlled receiver 400 illustrated in FIG. 4 according to the current embodiment of the present invention analogize with those of the receiver 200 illustrated in FIG. 2, a detailed description thereof is omitted. However, the receiver 200 illustrated in FIG. 2 and the receiver 400 illustrated in FIG. 4 are different from each other in that the signal which the second gain control block 480 included in the gain control block 460 of the receiver 400 receives is the output signal IF_S of the second variable gain control amplifier 450, and the signal that the second gain control block 280 included in the gain control block 260 of the receiver 200 receives is the output signal f2 of the filter 240.

Figure 5:
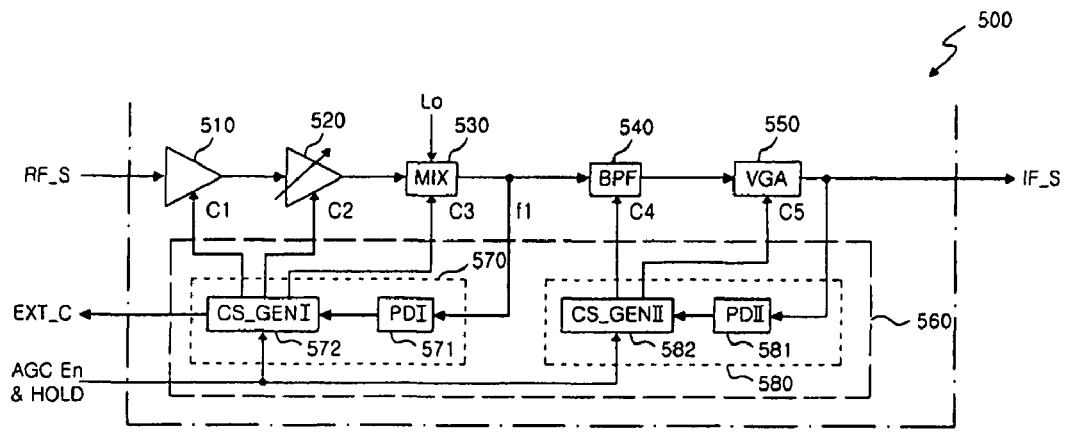

FIG. 5 illustrates a gain controlled receiver according to a fourth embodiment of the present invention.

Referring to FIG. 5, the gain controlled receiver 500 has the same construction as the gain controlled receiver 400 illustrated in FIG. 4 except that a gain of a second variable gain control amplifier 550 is controlled by a fifth gain control signal C5 output from a gain control block 560. Therefore, a detailed description of connection structures and operations of the gain controlled receiver 500 is omitted.

Figure 6:
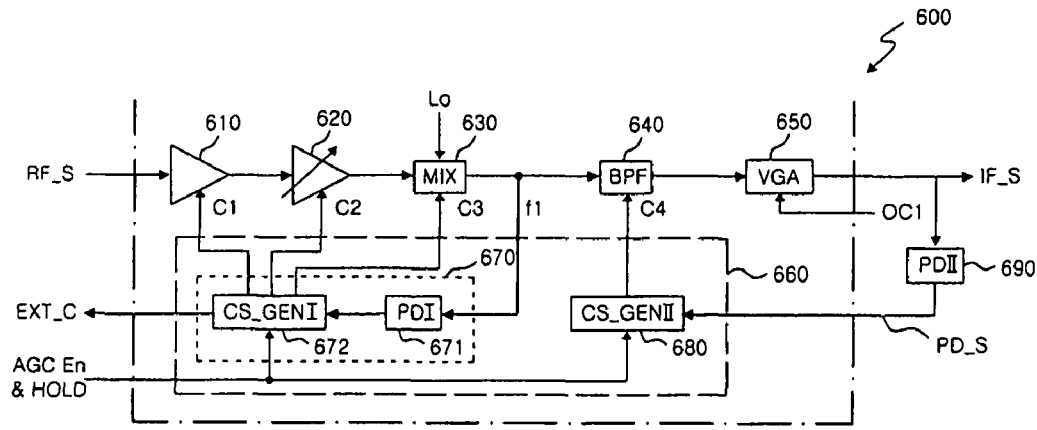

FIG. 6 illustrates a gain controlled receiver according to a fifth embodiment of the present invention.

Referring to FIG. 6, the gain controlled receiver 600 includes a low noise amplifier 610, a first variable gain control amplifier 620, a frequency mixer 630, a filter 640, a second variable gain control amplifier 650, and a gain control block 660.

The low noise amplifier 610 amplifies a received RF signal RF_S in response to a first gain control signal C1. The first variable gain control amplifier 620 amplifies a signal output from the low noise amplifier 610 in response to a second gain control signal C2. The frequency mixer 630 mixes a signal output from the first variable gain control amplifier 620 with a local oscillating signal Lo in response to a third gain control signal C3 to generate an IF signal f1. The filter 640 removes noise in an output signal f1 of the frequency mixer 630 in response to a fourth gain control signal C4. The second variable gain control amplifier 650 amplifies an output signal of the filter 640 in response to a fifth gain control signal OC1 and includes one or more variable gain amplifiers.

The gain control block 660 processes the received output signal f1 of the frequency mixer 630 and a peak detection signal PD_S having information about a peak of an output signal IF_S of the second variable gain control amplifier 650 in response to a gain control enable/hold signal AGC En & HOLD to generate the first to fourth gain control signals C1 to C4. To do this, the gain control block 660 includes a first gain control block 670 and a second gain control block 680.

The first gain control block 670 generates the first to third gain control signals C1 to C3 according to a state of the output signal f1 of the frequency mixer 630 in response to the gain control enable/hold signal AGC En & HOLD. To do this, the first gain control block 670 includes a first peak detector 671 and a first control signal generator 672. The first peak detector 671 detects a peak of the output signal f1 of the frequency mixer 630. The first control signal generator 672 generates the first to third gain control signals C1 to C3 by using a peak value of a signal output from the first peak detector 671 in response to the gain control enable/hold signal AGC En & HOLD. The first control signal generator 672 further generates one or more external device control signals EXT_C having information about a gain of an amplification device (not shown) which is provided outside the receiver 600.

The second gain control block 680 generates the fourth gain control signal C4 according to a state of the peak detection signal PD_S in response to the gain control enable/hold signal AGC En & HOLD. To do this, the second gain control block 680 includes a second control signal generator for generating the fourth gain control signal C4 by using the peak detection signal PD_S in response to the gain control enable/hold signal AGC En & HOLD.

In FIG. 6, the peak detection signal PD_S is an output signal of a peak detector 690 disposed outside the receiver 600. When the receiver 600 is implemented as a single semiconductor chip, the peak detector 690 is disposed outside the chip. The peak detection signal PD_S includes information on a peak of the output signal IF_S of the second variable gain control amplifier 650.

Figure 7:
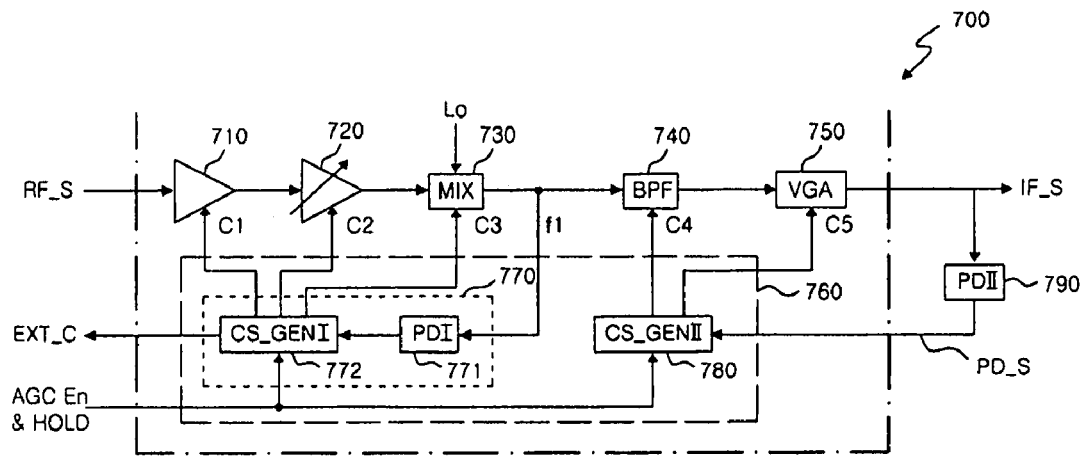

FIG. 7 illustrates a gain controlled receiver according to a sixth embodiment of the present invention.

Referring to FIG. 7, the gain controlled receiver 700 has the same construction as the gain controlled receiver 600 illustrated in FIG. 6 except that a gain of a second variable gain control amplifier 750 is controlled by a fifth gain control signal C5 output from a gain control block 760. Therefore, a detailed description of connection structures and operations of the gain controlled receiver 700 is omitted.

Figure 8:
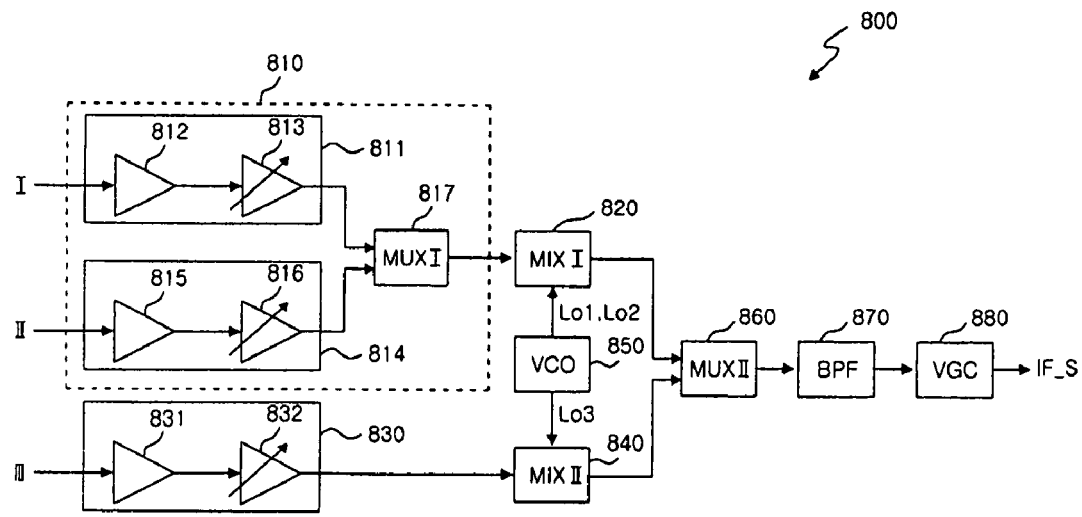
FIGS. 8 and 9 are views illustrating multi-band processing receivers according to embodiments of the present invention.

FIG. 8 illustrates a multi-band processing receiver according to a first embodiment of the present invention.

Referring to FIG. 8, the multi-band processing receiver 800 according to the first embodiment of the present invention includes a first receiving unit 810 and 820, a second receiving unit 830 and 840, a voltage-controlled oscillator (VCO) 850, a switch 860, a filter 870, and a variable gain amplifier 880.

The first receiving unit 810 and 820 includes a first amplifying unit 810 and a first frequency mixer 820.

The first amplifying unit 810 selects and outputs one of two received signals obtained by amplifying a first band RF signal 1 and a second band RF signal 1. To do this, the first amplifying unit 810 includes a first band amplifying unit 811, a second band amplifying unit 814, and a first multiplexer 817.

The first band amplifying unit 811 amplifies the first band RF signal I, and includes a first band low noise amplifier 812 for amplifying the first band RF signal I and a first band variable gain amplifier 813 for amplifying an output signal of the first band low noise amplifier 812. The second band amplifying unit 814 amplifies the second band RF signal II, and includes a second band low noise amplifier 815 for amplifying the second band RF signal II and a second band variable gain amplifier 816 for amplifying an output signal of the second band low noise amplifier 815. The first multiplexer 817 selects one from the output signals of the first band amplifying unit 811 and the second band amplifying unit 814. The first frequency mixer 820 mixes the signal output from the first amplifying unit 810 with a first oscillating signal Lo1 or Lo2 output from the VCO 850.

The second receiving unit 830 and 840 includes a second amplifying unit 830 and a second frequency mixer 840. The second amplifying unit 830 receives and amplifies a third band RF signal in and includes a third band low noise amplifier 831 for receiving and amplifying the third band RF signal m and a third band variable gain amplifier 832 for amplifying an output signal of the third band low noise amplifier 831. The second frequency mixer 840 mixes the signal output from the second amplifying unit 830 with a second oscillating signal Lo3 output from the VCO 850.

The switch 860 performs switching on the signals output from the first receiving unit 810 and 820 and the second receiving unit 830 and 840 to output an IF signal. The filter 870 performs filtering on the IF signal and has the same electrical characteristics as a band pass filter. The variable gain amplifier 880 amplifies an output signal of the filter 870.

As the first oscillating signal Lo1 and Lo2 output from the VCO 850, a first band local oscillating signal Lo1 is output when the signal output from the first amplifying unit 810 is a signal obtained by amplifying the first band RF signal I, and a second band local oscillating signal Lo2 is output when the signal output from the first amplifying unit 810 is a signal obtained by amplifying the second band RF signal II. The second oscillating signal Lo3 output from the VCO 850 is a third band local oscillating signal Lo3.

Here, the first band RF signal I, the second band RF signal II, and the third band RF signal III correspond to signals in a band-II between 88 MHz and 108 MHz, a band-III between 174 MHz and 245 MHz, and an L-band between 1452 MHz and 1492 MHz, respectively.

Figure 9:
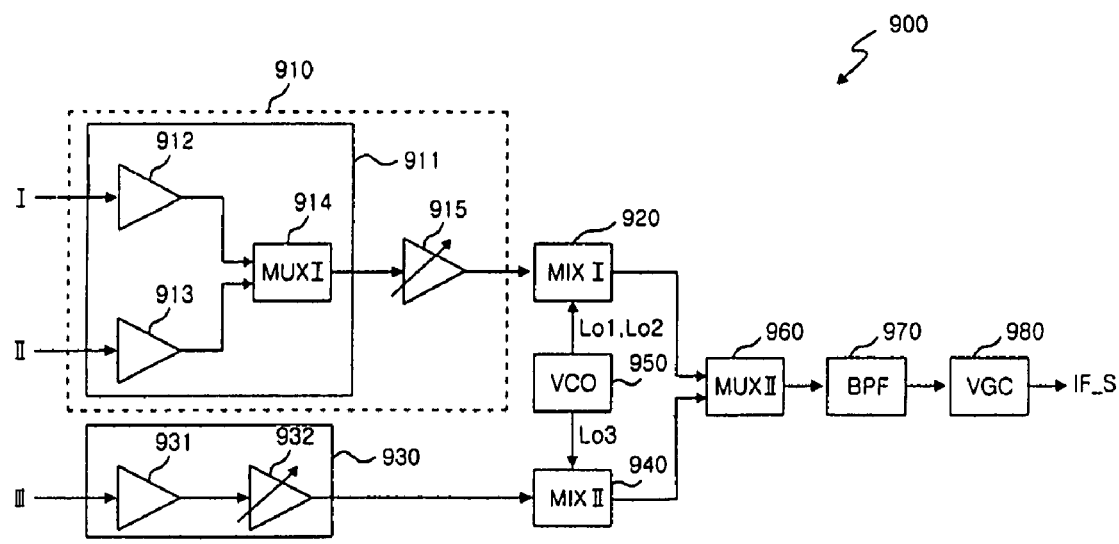

FIG. 9 illustrates a multi-band processing receiver according to a second embodiment of the present invention.

Referring to FIG. 9, a first receiving unit 910 and 920 of the multi-band processing receiver 900 is different from that of the multi-band processing receiver 800 illustrated in FIG. 8, and the rest of the construction of the receiver 900 is the same as that of the receiver 800, so that only the first receiving unit 910 and 920 is described in detail. The rest of the construction analogizes with that illustrated in FIG. 8, so that a detailed description thereof is omitted.

Referring to FIG. 9, the first receiving unit 910 and 920 includes an amplifying unit 910 and a first frequency mixer 920. The amplifying unit 910 includes a pre-amplifying stage 911 and a post-amplifying state 915. The pre-amplifing stage 911 selects and outputs one of two signals obtained by amplifying a first band RF signal I and a second band RF signal II. To do this the pre-amplifying stage 911 includes a first low noise amplifier 912 for amplifying the first band RF signal I, a second low noise amplifier 913 for amplifying the second band RF signal II, and a switch 914 for selecting one from output signals of the first low noise amplifier 912 and the second low noise amplifier 913. The post-amplifying stage 915 amplifies a signal output from the pre-amplifying stage 911. The first frequency mixer 920 mixes a signal output from the amplifying unit 910 with the first oscillating signal Lo1 or Lo2 output from the VCO 950.

Although not shown in the figure, the gain controlled receivers 200 to 700 and the multi-band processing receivers 800 and 900 according to the embodiments of the present invention can be integrated to simultaneously perform the aforementioned two functions. Operations of the integrated receiver can be understood by the aforementioned operations of the receivers.

As described above, the gain controlled receiver according to the embodiments of the present invention reduces the number of external devices used for gain control of the receiver, so that a structure of a receiving system can be simplified and a consumed area can be reduced. In addition, the multi-band processing receiver according to the embodiments of the present invention can process three or more RF signals in multi-band by using a single receiver. The gain controlled receiver and the multi-band processing receiver can be integrated into a single receiver. When the receiver is implemented as a semiconductor chip, the aforementioned advantages according to the embodiments of the present invention can be increased.

While the present invention has been particularly shown and described with reference to exemplary embodiments thereof, it Will be understood by those skilled in the art that various changes in form and details may be made therein without departing from the spirit and scope of the present invention as defined by the appended claims.

What is claimed is:

1. A gain controlled receiver, comprising:
   a low noise amplifier amplifying a received RF (radio frequency) signal in response to a first gain control signal;
   a first variable gain control amplifier amplifying a signal output from the low noise amplifier in response to a second gain control signal;
   a frequency mixer mixing a signal output from the first variable gain control amplifier with a local oscillating signal in response to a third gain control signal to generate an IF (intermediate frequency) signal;

a filter removing noise in an output signal of the frequency mixer in response to a fourth gain control signal;

a second variable gain control amplifier amplifying an output signal of the filter in response to a fifth gain control signal, and including one or more variable gain amplifiers; and a gain control block processing the received output signal of the frequency mixer and the output signal of the filter to generate the first to fourth gain control signals, wherein the gain control block comprises:

a first gain control block generating the first to third gain control signals according to a state of the output signal of the frequency mixer; and a second gain control block generating the fourth gain control signal according to a state of the output signal of the filter.

2. The gain controlled receiver of claim 1, wherein the first gain control block comprises:

a first peak detector detecting a peak of the output signal of the frequency mixer; and a first control signal generator generating the first to third gain control signals by using a peak value of a signal output from the first peak detector.

3. The gain controlled receiver of claim 2, wherein the first control signal generator further generates one or more external device control signals having information about a gain of an amplification device which is provided outside the receiver.

4. The gain controlled receiver of claim 1, wherein the second gain control block comprises:

a second peak detector detecting a peak of the output signal of the filter; and a second control signal generator generating the fourth gain control signal by using a peak value of a signal output from the second peak detector.

5. The gain controlled receiver of claim 4, wherein the second control signal generator further generates the fifth gain control signal.

6. The gain controlled receiver of claim 1, wherein the gain control block further receives a gain control enable/hold signal for controlling operations of the gain control block in order to be operated.

7. A gain controlled receiver, comprising:

a low noise amplifier amplifying a received RF signal in response to a first gain control signal;

a first variable gain control amplifier amplifying a signal output from the low noise amplifier in response to a second gain control signal;

a frequency mixer mixing a signal output from the first variable gain control amplifier with a local oscillating signal in response to a third gain control signal to generate an IF signal;

a filter removing noise in an output signal of the frequency mixer in response to a fourth gain control signal;

a second variable gain control amplifier amplifying an output signal of the filter in response to a fifth gain control signal, and including one or more variable gain amplifiers; and a gain control block processing the received output signal of the frequency mixer and the output signal of the second variable gain control amplifier to generate the first to fourth gain control signals, wherein the gain control block comprises:

a first gain control block generating the first to third gain control signals according to a state of the output signal of the frequency mixer; and a second gain control block generating the fourth gain control signal according to a state of the output signal of the second variable gain control amplifier.

8. The gain controlled receiver of claim 7, wherein the first gain control block comprises:

a first peak detector detecting a peak of the output signal of the frequency mixer; and a first control signal generator generating the first to third gain control signals by using a peak value of a signal output from the first peak detector.

9. The gain controlled receiver of claim 8, wherein the first control signal generator further generates one or more external device control signals having information about a gain of an amplification device which is provided outside the receiver.

10. The gain controlled receiver of claim 7, wherein the second gain control block comprises:

a second peak detector detecting a peak of the output signal of the second variable gain control amplifier; and a second control signal generator generating the fourth gain control signal by using a peak value of a signal output from the second peak detector.

11. The gain controlled receiver of claim 10, wherein the second control signal generator further generates the fifth gain control signal.

12. The gain controlled receiver of claim 7, wherein the gain control block further receives a gain control enable/hold signal for controlling operations of the gain control block in order to be operated.

13. The gain controlled receiver of claim 7, wherein the gain control block processes the received output signal of the frequency mixer and a peak detection signal having information about a peak of an output signal of the second variable gain control amplifier to generate the first to fourth gain control signals.

14. The gain controlled receiver of claim 13, wherein the gain control block comprises:

a first gain control block generating the first to third gain control signals according to a state of the output signal of the frequency mixer; and a second gain control block generating the fourth gain control signal according to a state of the peak detection signal.

15. The gain controlled receiver of claim 14, wherein the first gain control block comprises:

a first peak detector detecting a peak of the output signal of the frequency mixer; and a first control signal generator generating the first to third gain control signals by using a peak value of a signal output from the first peak detector.

16. The gain controlled receiver of claim 15, wherein the first control signal generator further generates one or more external device control signals having information about a gain of an amplification device which is provided outside the receiver.

17. The gain controlled receiver of claim 14, wherein the second gain control block comprises a second control signal generator generating the fourth gain control signal by using the peak detection signal.

18. The gain controlled receiver of claim 17, wherein the second control signal generator further generates the fifth gain control signal.

19. The gain controlled receiver of claim 14, wherein the gain control block further receives a gain control enable/hold signal for controlling operations of the gain control block in order to be operated.

* * * * *